United States Patent [19]

Hsu

[11] Patent Number: 5,786,253
[45] Date of Patent: Jul. 28, 1998

[54] METHOD OF MAKING A MULTI-LEVEL ROM DEVICE

[75] Inventor: Chen-Chung Hsu, Taichung, Taiwan

[73] Assignee: United Microelectronics Corporation, Taipei, Taiwan

[21] Appl. No.: 892,025

[22] Filed: Jul. 14, 1997

[30] Foreign Application Priority Data

Apr. 18, 1997 [TW] Taiwan ................... 86105074

[51] Int. Cl.⁶ ................... H01L 21/8246; H01L 21/8234
[52] U.S. Cl. ................... 438/275; 438/277; 438/282
[58] Field of Search ................... 438/128, 275–279, 438/282; 257/390–392

[56] References Cited

U.S. PATENT DOCUMENTS 4,180,826  12/1979  Shappir ................... 438/275
5,394,356   2/1995  Yang ................... 438/276

*Primary Examiner*—Joni Chang
*Attorney, Agent, or Firm*—Rabin & Champagne, P.C.

[57] ABSTRACT

A method of making multi-level ROM devices in which the gate width controls the threshold voltage setting of each memory unit, instead of the conventional method of setting the threshold voltage through the implantation of ions into the channel region of a memory unit. The memory units include memory units having their word line polysilicon layer completely removed, which are units in an OFF state. Memory units having part of the word line polysilicon layer removed are units with a higher threshold voltage, while memory units having the word line polysilicon layer left untouched are memory units with a lower threshold voltage.

8 Claims, 5 Drawing Sheets

5,786,253

METHOD OF MAKING A MULTI-LEVEL ROM DEVICE

BACKGROUND OF THE INVENTION

1. Field of the Invention

This invention relates, in general, to a method of making a multi-level read-only-memory (ROM) device. More particularly, the present invention is directed toward a method of making a multi-level ROM device that utilizes the gate width to control the threshold voltage setting of a memory unit.

2. Description of the Related Art

ROM devices are widely used in digital equipment, such as microcomputers and microprocessor operating systems. Resident programs used by operating systems, such as BIOS, are normally kept in ROM. Due to the complicated manufacturing process of ROM devices, which involve many time consuming steps, such as material processing steps, customers will generally submit their program codes to the ROM factory, and then let the factory code the programs into their ROM products.

Most ROM components, aside from a difference in the code stored during a programming phase, basically have the same physical structure. Therefore, ROM devices are typically manufactured up to a point immediately before the actual programming is performed. The partially finished ROM products are then stored in a warehouse. When a customer places an order requiring a certain program code to be installed in the ROM device, a set of photomasks can be promptly manufactured, and subsequent programming carried out with short notice. The practice of photomask programming on prefabricated ROM devices is now the norm in the semiconductor manufacturing industry.

In general, a channel transistor is usually used as the basic memory unit of the ROM device. During the programming phase, ions are selectively implanted into specified channels, so as to adjust their threshold voltages, thus controlling an ON/OFF state of the memory unit.

FIG. 1 is a top view of an integrated circuit layout of memory units 10, 11 and 12 in a conventional ROM device. Polysilicon word lines (WL) cross over polysilicon bit lines (BL), to form a channel 13 of a memory unit (such as 10), which is located in a region between two adjacent bit lines (BL) and below the area covered by the word line (WL). Whether a binary bit of "0" or "1" is set is mainly determined by the presence or absence of implanted ions in channel region 13.

Typically, multi-level ROM devices are fabricated using a double code implantation method. Using separate operations, ions are implanted into designated channel regions, to create memory units having different threshold voltages (i.e., memory units having multiple-level logic states). For example, three different types of memory units, having threshold voltages VT, VT1 and VT2, respectively, may be generated in this way. The current/voltage relationship of threshold voltages VT, VT1 and VT2 is shown in FIG. 2. However, in the conventional method for making multi-level ROM devices, as described above, since ions at different concentration levels must be implanted in designated regions to achieve the threshold voltage adjustments, component breakdown voltages will be correspondingly lowered.

SUMMARY OF THE INVENTION

It is therefore an object of this invention to provide a method of making a multi-level ROM device whose memory unit threshold voltage can be varied by changing its gate width, instead of requiring separate ion implantation operations with each implantation having a different level of ion concentration.

Another object of this invention is to provide a method of making a multi-level ROM device whose memory unit threshold voltage can be varied by changing its gate width, instead of having separate ion implantation operations, so that component breakdown voltage is not lowered.

The method of making a multi-level ROM device according to this invention includes providing a first type substrate, then forming a plurality of embedded bit lines along a first direction by implanting second type ions into the substrate. A thermal oxidation reaction is performed to form an oxide layer over the surface of the substrate and the surface of the embedded bit lines. A high impurity concentration polysilicon layer and a tungsten silicide layer are formed in sequence above the surface of the oxide layer. Patterns are simultaneously defined on the high impurity concentration polysilicon layer as well as on the tungsten silicide layer, to form a plurality of word lines extending along a second direction, with the second direction and the first direction crossing each other at an angle. A dielectric layer is formed over the oxide layer and the surface of the word lines. A pattern is defined on the dielectric layer to form a plurality of contact windows in specific locations above the word lines and in between the embedded bit lines. Each contact window has a width slightly bigger than the width of the word line so as to expose part of the tungsten silicide layer and the oxide layer below. A first photoresist layer is coated. Then, a pattern is defined on the first photoresist layer to expose some of the contact windows. A wet etching method is used to remove the exposed high impurity concentration polysilicon layer underneath the contact windows, leaving behind only the tungsten silicide layer. Thereafter, the first photoresist layer is removed. A second photoresist layer is coated. Then, a pattern is defined on the second photoresist layer to expose the other unetched contact windows. Using a wet etching method, part of the high impurity concentration polysilicon layer below the contact windows is removed such that the width of the polysilicon layer is narrowed. Thereafter, the second photoresist layer is removed.

BRIEF DESCRIPTION OF THE DRAWINGS

Other objects, features, and advantages of the invention will become apparent from the following detailed description of the preferred but non-limiting embodiment. The description is made with reference to the accompanying drawings, in which.

DESCRIPTION OF THE PREFERRED EMBODIMENT

FIGS. 3A through 3E are a series of cross-sectional views taken at various stages during the manufacturing of a multi-level ROM device, according to one preferred embodiment of this invention.

Figure 1:
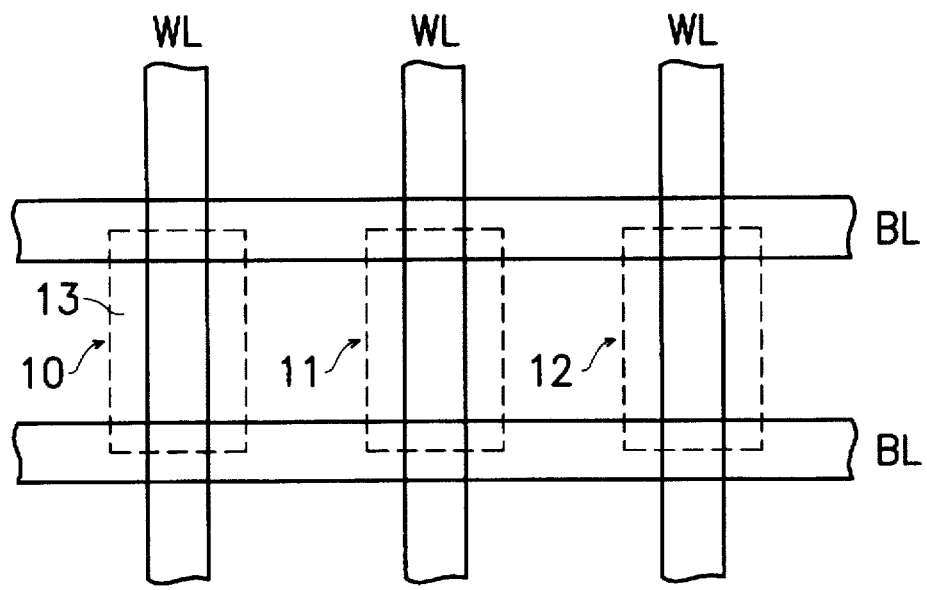
FIG. 1 is a top view of a portion of an integrated circuit layout of memory units in a conventional ROM device.
Figure 2:
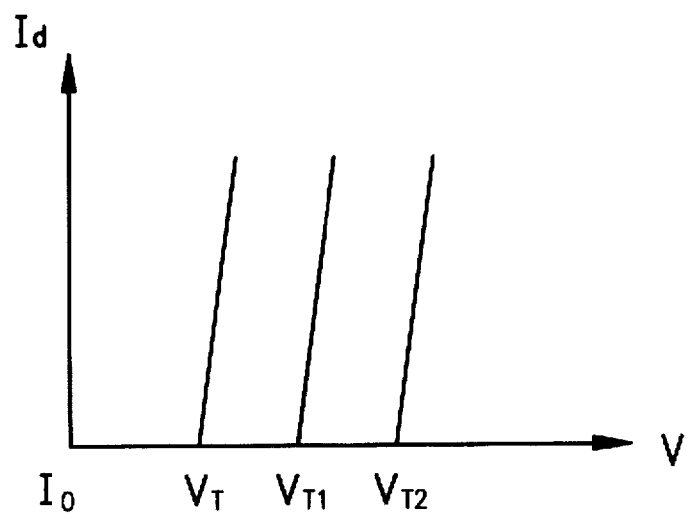
FIG. 2 is a graph showing the relationship of drain current versus threshold voltages for memory units having different ion implantation concentrations in their designated channel regions.
Figure 3A:
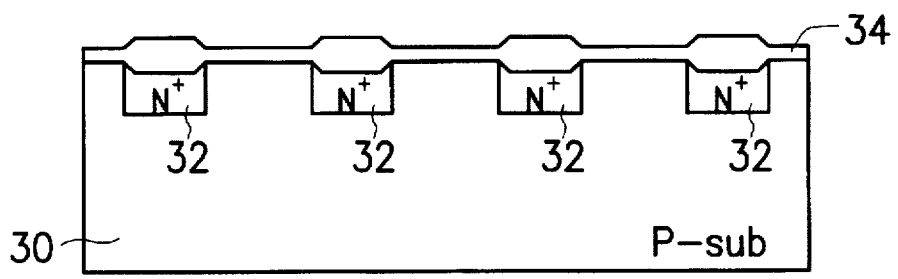
FIGS. 3A through 3E are a series of cross-sectional views of the manufacturing flow of a multi-level ROM device, according to one preferred embodiment of this invention.

First, and referring to FIG. 3A, a substrate 30, for example, a P-type silicon substrate, is provided. Then, a photoresist layer (not shown in the Figure) is coated over the substrate 30. A photolithographic process is performed to expose the necessary bit line regions. Next, N-type ions, for example, arsenic ions, having an energy of about 50 to about 100 KeV and a dopant concentration of about $10^{14}$ to about $10^{16}$/cm$^2$, are used during an ion implantation procedure to form a plurality of embedded bit lines 32. Thereafter, a high temperature, for example, about 850° to about 950° C., is used during a thermal oxidation reaction procedure to form an oxide layer 34 above the substrate 30 and the surface of the embedded bit lines 32. Since the oxidation rate for an impurity-doped polysilicon layer is faster than that for just a silicon layer, the portion of the oxide layer 34 above the surface of the embedded bit lines 32 is thicker than the portion of the oxide layer 34 above the surface of the substrate 30.

Figure 3B:
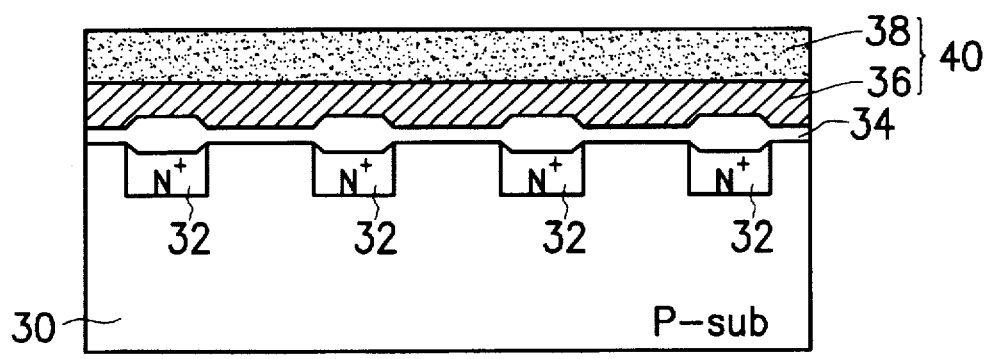

Referring next to FIG. 3B, a high impurity concentration polysilicon layer 36 and a tungsten silicide layer 38 are formed in sequence above the surface of the oxide layer 34. Then, a pattern is defined simultaneously on the high impurity concentration polysilicon layer 36 and the tungsten silicide layer 38 to form a plurality of word lines 40. The word lines 40 are composed of both the high impurity concentration polysilicon layer 36 and the tungsten silicide layer 38. Furthermore, the word lines 40 and the embedded bit lines 32 cross over each other at an angle, for example, at a right angle. At the junction between a word line 40 and two adjacent embedded bit lines 32, a memory unit is formed whose channel region is in the substrate located between the two adjacent embedded bit lines 32.

Figure 3C:
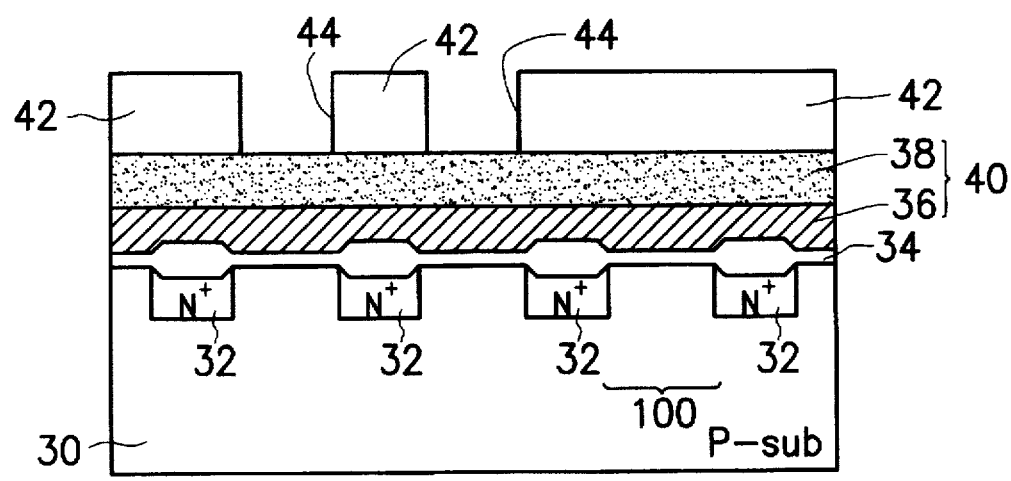

Referring next to FIG. 3C, a dielectric layer 42, for example, a borophosphosilicate glass or a silicon dioxide layer formed using tetra-ethyl-ortho-silicate (TEOS), is formed over the surfaces of the word lines 40 and the oxide layer 34. Thereafter, a pattern is defined on the dielectric layer 42. A plurality of contact windows 44 are formed above the word lines 40 and positioned between the embedded bit lines 32. The contact windows 44 are slightly larger than the width of a word line 40, so that the tungsten silicide layer 38 and the oxide layer 34 (at the two sidewalls of a respective word line 40) are exposed. Those memory units without a contact window 44 thereabove, form a first type of memory units 100.

Figure 3D:
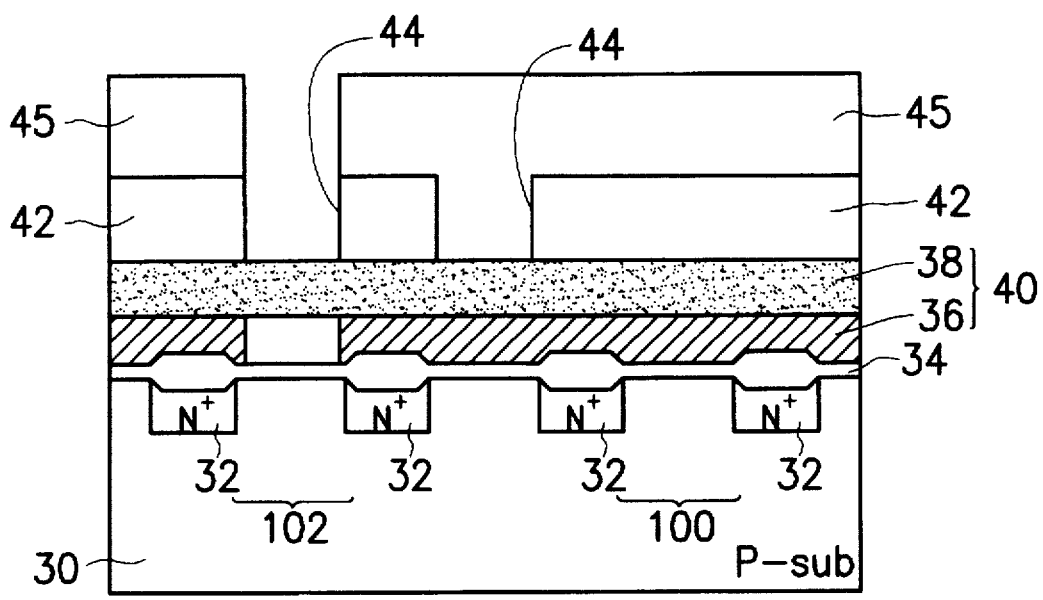

Thereafter, and referring to FIG. 3D, a photoresist layer 45 is applied to coat the dielectric layer, and fill the contact windows. The photoresist layer 45 is then defined to expose some of the contact windows 44. Subsequently, wet etching is used to completely remove the portion of the high impurity concentration polysilicon layer 36 located underneath the portion of tungsten silicide layer 38 which is exposed by way of the exposed contact window 44, leaving only the tungsten silicide layer 38. This forms the second type of memory units 102. Subsequently, the photoresist layer 45 is removed.

Figure 3E:
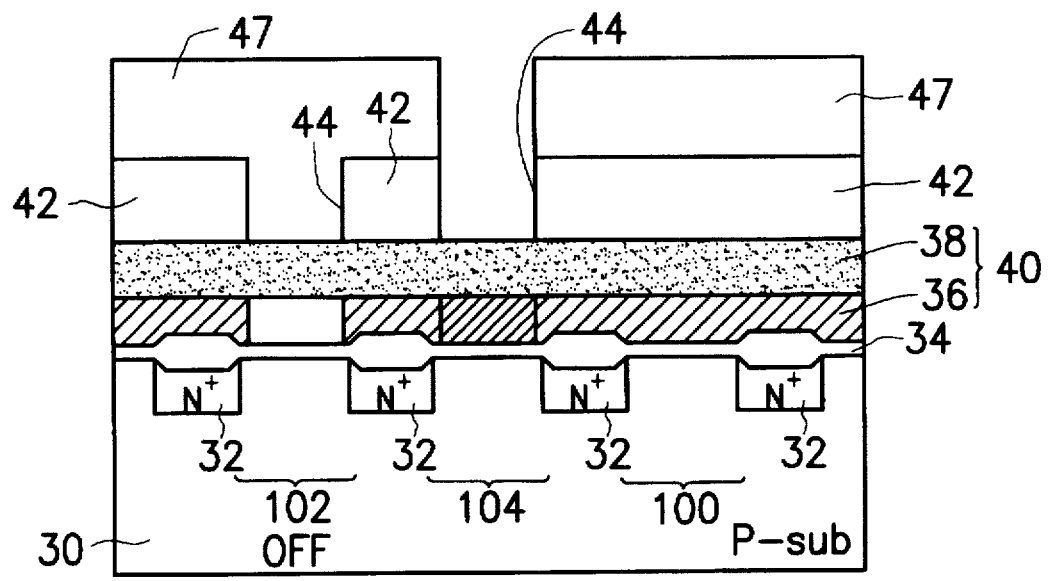

Referring next to FIG. 3E, another photoresist layer 47 is applied to coat the dielectric layer 42 and fill the contact windows. Photoresist layer 47 is then defined to expose the remaining (and unetched) contact windows. Again, using wet etching, the portion of the high impurity concentration polysilicon layer 36 underneath the portion of the tungsten silicide layer 38 which is exposed due to exposed contact window 44, is partially removed by controlling the etching time. As a result, its width is narrowed (as been seen in FIG. 4). This forms the third type of memory units 104. Thus, each type of memory unit has a different threshold voltage.

Subsequently, photoresist layer 47 is removed. Further subsequent processes are identical to the conventional processes, and so detailed descriptions are omitted here.

In the above embodiment, a P-type silicon substrate having N-type embedded bit lines is chosen as an example. However, an N-type silicon substrate having a P-type embedded bit lines can also be used.

Figure 4:
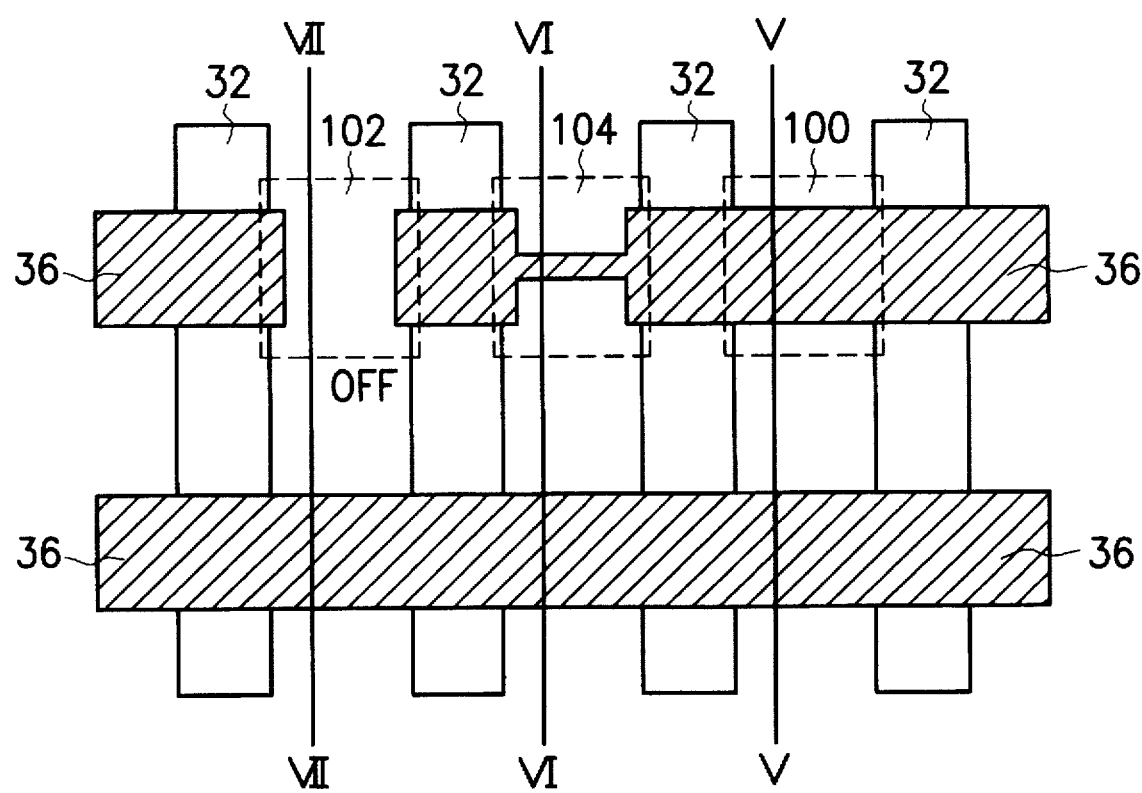
FIG. 4 is a top view showing part of the multi-level ROM device according to one preferred embodiment of this invention.
Figure 5:
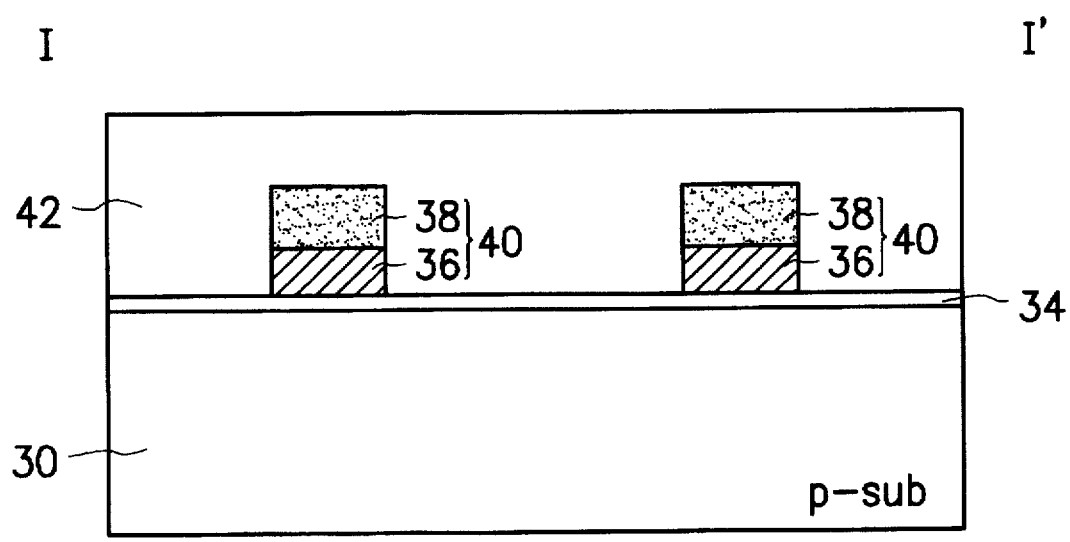
FIGS. 5 through 7 are a series of cross-sectional views taken at different locations of the multi-level ROM, according to this invention.
Figure 6:
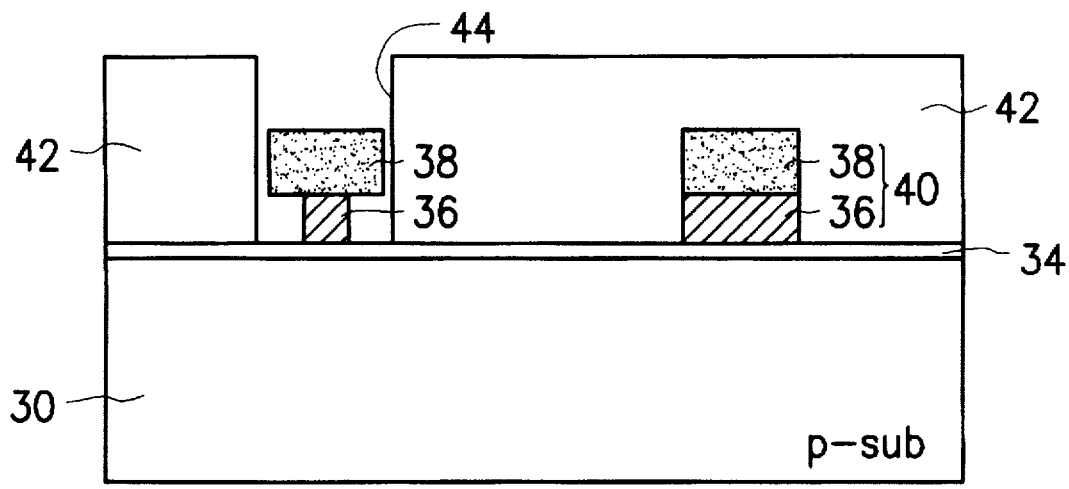
Figure 7:
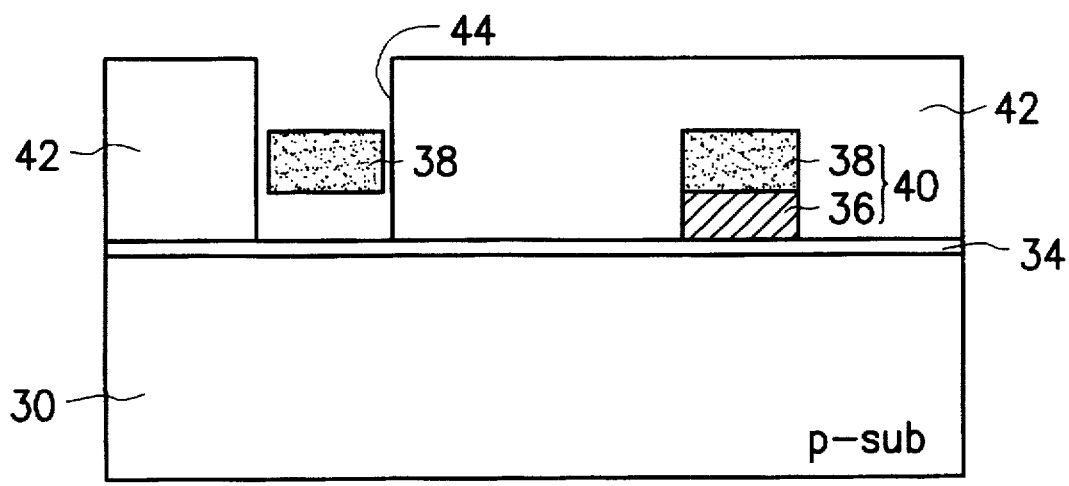

FIG. 4 is a top view of a portion of the multi-level ROM device according to this invention. In the Figure, only the high impurity concentration polysilicon layers 36 of the word lines are shown, while the tungsten silicide layers 38 are hidden to make the various types of memory units stand out. FIGS. 5 through 7 are respective cross-sectional views, taken along lines V—V, VI—VI and VII—VII of FIG. 4.

The first type of memory unit 100 and the third type of memory unit 104 both have an "ON" state, because both contain a high impurity concentration polysilicon layer 36 in their respective word line 40. The difference between them is that the first type of memory unit 100 has a wider high impurity concentration polysilicon layer 36 than the third type of memory unit 104. Hence, the first type of memory unit 100 has a lower threshold voltage than the third type of memory unit 104. Due to the complete absence of a high impurity concentration polysilicon layer 36 in the word line 40 of the second type of memory unit 102, memory unit 102 cannot be switched on and therefore remains in an "OFF" state. Thus, through the effective control of the line width of the high impurity concentration polysilicon layer 36 in a word line 40, the threshold voltage of each memory unit can be adjusted in steps to form a multi-level ROM device.

While the invention has been described by way of example and in terms of a preferred embodiment, it is to be understood that the invention is not limited to the disclosed embodiment. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method of making a multiple-level ROM device, comprising:

providing a substrate comprised of a first conductivity type of ions;

implanting a second conductivity type of ions into the substrate to form a plurality of embedded bit lines extending in a first direction;

forming an oxide layer over a surface of the substrate and a surface of the embedded bit lines;

forming an impurity doped polysilicon layer and a tungsten silicide layer, in sequence, above a surface of the oxide layer;

simultaneously patterning the impurity doped polysilicon layer and the tungsten silicide layer to form a plurality of word lines extending in a second direction, with the second direction and the first direction crossing each other at an angle;

forming a dielectric layer over the oxide layer and a surface of the word lines;

patterning the dielectric layer and forming a plurality of contact windows therein, each being located above a word line and in between two adjacent bit lines, and each having a width that is larger than a width of the respective word line so that a portion of the tungsten silicide layer and the oxide layer therebelow is exposed, wherein at least a first group of memory unit is provided and defined by an absence of a contact window thereabove;

coating the dielectric layer with a first photoresist layer;

patterning the first photoresist layer to expose some of the contact windows;

wet etching and removing all of the impurity doped polysilicon layer underneath the exposed contact windows, while leaving behind the tungsten silicide layer, so as to form a second group of memory unit;

removing the first photoresist layer;

coating the dielectric layer with a second photoresist layer;

patterning the second photoresist layer to expose remaining contact windows;

wet etching and removing a portion of the impurity doped polysilicon layer underneath the exposed remaining contact windows so as to narrow a width of the impurity doped polysilicon layer, thereby forming a third group of memory unit; and removing the second photoresist layer.

2. The method according to claim 1, wherein the first conductivity type of ions comprises P-type ions, and the second conductivity type of ions comprises N-type ions.

3. The method according to claim 1, wherein the first conductivity type of ions comprises N-type ions, and the second conductivity type of ions comprises P-type ions.

4. The method according to claim 1, wherein said forming an oxide layer includes performing a thermal oxidation reaction to form a silicon dioxide layer.

5. The method according to claim 4, wherein said performing a thermal oxidation reaction includes performing the thermal oxidation reaction at a temperature of about 850° to about 950° C.

6. The method according to claim 1, wherein the first direction is perpendicular to the second direction.

7. The method according to claim 1, wherein said forming a dielectric layer includes forming the dielectric layer of a borophosphosilicate glass.

8. The method according to claim 1, wherein said forming a dielectric layer includes using tetra-ethyl-ortho-silicate.

* * * * *